(12) United States Patent
Liu et al.

(10) Patent No.: US 12,191,264 B2
(45) Date of Patent: Jan. 7, 2025

(54) THERMAL PERFORMANCE IMPROVEMENT AND STRESS REDUCTION IN SEMICONDUCTOR DEVICE MODULES

(71) Applicant: SEMICONDUCTOR COMPONENTS INDUSTRIES, LLC, Phoenix, AZ (US)

(72) Inventors: Yong Liu, Cumberland Foreside, ME (US); Qing Yang, Shenzhen (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 456 days.

(21) Appl. No.: 17/658,118

(22) Filed: Apr. 6, 2022

(65) Prior Publication Data

US 2023/0326876 A1 Oct. 12, 2023

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4807* (2013.01); *H01L 21/565* (2013.01);
(Continued)

(58) Field of Classification Search
CPC . H01L 23/562; H01L 21/4807; H01L 21/565; H01L 23/3735; H01L 24/40; H01L 24/48; H01L 25/072; H01L 25/18; H01L 25/50; H01L 2224/40225; H01L 2224/48225; H01L 2924/1203; H01L 2924/13055; H01L 2924/13091;
(Continued)

(56) References Cited

U.S. PATENT DOCUMENTS 9,275,926 B2 3/2016 Hable et al.
9,390,996 B2 7/2016 Jeon
(Continued)

FOREIGN PATENT DOCUMENTS

WO 2021181831 A1 9/2021

OTHER PUBLICATIONS

Systems Plus Consulting, "Infineon FF4OOR07A01E3 Double Side Cooled IGBT Module," Reverse Costing and Technology Analysis Report, Jan. 2018.
(Continued)

*Primary Examiner* — Elias Ullah
(74) *Attorney, Agent, or Firm* — Brake Hughes Bellermann LLP

(57) ABSTRACT

In some aspects, the techniques described herein relate to a signal distribution assembly configured to conduct signals in a semiconductor device module, the signal distribution assembly including: a metal layer, the metal layer having: a first side, the first side being planar; and a second side opposite the first side, the second side being non-planar and including: a base portion; a first post extending from the base portion; and a second post extending from the base portion. The metal layer can be pre-molded using a molding compound disposed on the second side of the metal later, with respective surfaces of the first post and the second posted exposed through the molding compound, and or the metal layer can be coupled with a thermally conductive insulator (e.g., ceramic) layer.

20 Claims, 8 Drawing Sheets

(51) Int. Cl.
*H01L 21/56* (2006.01)
*H01L 23/373* (2006.01)
*H01L 25/00* (2006.01)
*H01L 25/07* (2006.01)
*H01L 25/18* (2023.01)

(52) U.S. Cl.
CPC .......... *H01L 23/3735* (2013.01); *H01L 24/40* (2013.01); *H01L 24/48* (2013.01); *H01L 25/072* (2013.01); *H01L 25/18* (2013.01); *H01L 25/50* (2013.01); *H01L 2224/40225* (2013.01); *H01L 2224/48225* (2013.01); *H01L 2924/1203* (2013.01); *H01L 2924/13055* (2013.01); *H01L 2924/13091* (2013.01); *H01L 2924/15787* (2013.01); *H01L 2924/351* (2013.01)

(58) Field of Classification Search
CPC ..... H01L 2924/15787; H01L 2924/351; H01L 23/49811; H01L 23/3107; H01L 23/5386; H01L 25/16; H05K 2201/066; H05K 1/0204; H05K 3/0061; H05K 7/14329
See application file for complete search history.

(56) References Cited

U.S. PATENT DOCUMENTS

| | | |
|---|---|---|
| 2011/0254177 A1 | 10/2011 | Malhan et al. |
| 2017/0064808 A1 | 3/2017 | Rizza et al. |
| 2020/0176348 A1 | 6/2020 | Lim |

OTHER PUBLICATIONS

Extended European Search Report for counterpart European Patent Application No. 23161540.2, mailed Aug. 11, 2023, 12 pages.

THERMAL PERFORMANCE IMPROVEMENT AND STRESS REDUCTION IN SEMICONDUCTOR DEVICE MODULES

TECHNICAL FIELD

This description relates to semiconductor device module (semiconductor device assemblies, semiconductor device module assemblies, etc.). More specifically, this description relates to semiconductor device modules with improved thermal performance and mechanical stress reduction.

BACKGROUND

Semiconductor device assemblies, such as assemblies including power semiconductor devices, such as power transistors (e.g., insulated-gate bipolar transistors (IGBTs), power metal-oxide-semiconductor field effect transistors (MOSFETs), etc.) can be implemented using multiple semiconductor die, one or more substrates (e.g., direct-bonded metal substrates) and electrical interconnections, such as bond wires, conductive spacers and conductive clips, as well as a molding compound (e.g., an epoxy molding compound) that is used as an encapsulant to protect other components of an associated device assembly. Such power transistor devices can be used in a number of applications, including automotive and/or industrial applications.

For instance, such power transistor devices can be used to implement electrical inverters used in electrical vehicles (EVs) and/or hybrid electrical vehicles (HEVs). Current implementations of semiconductor device assemblies including such power transistors (e.g., in combination with a fast recovery diode (FRD)) have certain drawbacks, however. For instance, current implementations may only allow for cooling of the assembly (e.g., by attaching a thermal dissipation appliance) on a single side of the assembly. This can cause and/or exacerbate stresses between components within such an assembly, such as tensile stress and strain energy on the included semiconductor die, which can damage (e.g., crack) those semiconductor die. As power requirements and associated operating temperatures for such devices increase, incidents of such damage will also increase.

SUMMARY

In some aspects, the techniques described herein relate to a semiconductor device module including: a substrate including: a first ceramic layer; and a first metal layer disposed on a first surface of the substrate; and a first semiconductor die, a first side of the first semiconductor die being coupled to the first metal layer; a second semiconductor die, a first side of the second semiconductor die being coupled to the first metal layer; and a signal distribution assembly including a second metal layer, the second metal layer having: a first side, the first side being planar; and a second side opposite the first side, the second side being non-planar and including: a base portion; a first post extending from the base portion, the first post being coupled with a second side of the first semiconductor die opposite the first side of the first semiconductor die; and a second post extending from the base portion, the second post being coupled with a second side of the second semiconductor die opposite the first side of the second semiconductor die, the signal distribution assembly electrically coupling the first semiconductor die with the second semiconductor die.

In some aspects, the techniques described herein relate to a semiconductor device module, further including a second ceramic layer coupled with the first side of the second metal layer.

In some aspects, the techniques described herein relate to a semiconductor device module, wherein the second ceramic layer is a thermally conductive ceramic layer that is coupled with the first side of the second metal layer via a thermally conductive epoxy adhesive.

In some aspects, the techniques described herein relate to a semiconductor device module, wherein: the signal distribution assembly is pre-molded and includes a molding compound disposed on the second side of the second metal layer; a surface of the first post that is coupled with the first semiconductor die is exposed through the molding compound; and a surface of the second post that is coupled with the second semiconductor die is exposed through the molding compound.

In some aspects, the techniques described herein relate to a semiconductor device module, further including: an insulator layer, a first surface of the insulator layer being coupled with the first side of the second metal layer; and a third metal layer coupled with a second surface of the insulator layer opposite the first surface of the insulator layer.

In some aspects, the techniques described herein relate to a semiconductor device module, wherein the insulator layer electrically insulative and thermally conductive.

In some aspects, the techniques described herein relate to a semiconductor device module, wherein: the second metal layer has an overall thickness of less than 1 millimeter (mm); and the first post and the second post have a same height of less than 0.5 mm.

In some aspects, the techniques described herein relate to a semiconductor device module, wherein the same height is less than 0.2 mm.

In some aspects, the techniques described herein relate to a semiconductor device module, wherein: the base portion is a first base portion; the first base portion, the first post and the second post are included in a first portion of the second metal layer; and the second metal layer further includes a second portion having: a second base portion; and a third post extending from the second base portion, the third post being coupled with the second side of the first semiconductor die.

In some aspects, the techniques described herein relate to a semiconductor device module, wherein: the first semiconductor die is one of an insulated-gate bipolar transistor (IGBT) or a metal-oxide-silicon field-effect transistor (MOSFET); the second semiconductor die is a fast-recovery diode (FRD); and the first post being coupled with one of an emitter terminal of the IGBT, or with a source terminal of the MOSFET; the second post being coupled with a cathode of the FRD; and the third post being coupled with a gate terminal of the IGBT, or with a gate terminal of the MOSFET.

In some aspects, the techniques described herein relate to a semiconductor device module, wherein the first portion of the second metal layer further includes a fourth post extending from the first base portion, the fourth post being coupled with a signal terminal of a leadframe of the semiconductor device module, the signal terminal being an emitter signal terminal, or a source signal terminal.

In some aspects, the techniques described herein relate to a semiconductor device module, wherein the first portion of the second metal layer includes a fourth post extending from the first base portion, the fourth post being coupled with a thermal sense signal pin of a leadframe of the semiconductor device module.

In some aspects, the techniques described herein relate to a semiconductor device module, wherein the second portion of the second metal layer includes a fourth post extending from the second base portion, the fourth post being coupled with a gate signal pin of a leadframe of the semiconductor device module.

In some aspects, the techniques described herein relate to a semiconductor device module, wherein: the signal distribution assembly is pre-molded and includes a molding compound disposed on the second side of the second metal layer; a surface of the first post that is coupled with the first semiconductor die is exposed through the molding compound; a surface of the second post that is coupled with the second semiconductor die is exposed through the molding compound; and a surface of the third post that is coupled with the gate terminal of the IGBT, or with the gate terminal of the MOSFET is exposed through the molding compound.

In some aspects, the techniques described herein relate to a semiconductor device module, wherein: the first base portion of the second metal layer is coupled with a signal terminal of a leadframe of the semiconductor device module, the signal terminal being an emitter signal terminal, or a source signal terminal; the first base portion of the second metal layer is further coupled with a thermal sense signal pin of the leadframe; and the second base portion of the second metal layer is coupled with a gate signal pin of the leadframe.

In some aspects, the techniques described herein relate to a signal distribution assembly configured to conduct signals in a semiconductor device module, the signal distribution assembly including: a metal layer, the metal layer having: a first side, the first side being planar; and a second side opposite the first side, the second side being non-planar and including: a base portion; a first post extending from the base portion; and a second post extending from the base portion; and a molding compound disposed on the second side of the metal layer, an upper surface of the first post and an upper surface of the second post being exposed through the molding compound; and a thermally conductive ceramic layer coupled with the first side of the metal layer, the thermally conductive ceramic layer being coupled with the first side of the metal layer via a thermally conductive epoxy adhesive.

In some aspects, the techniques described herein relate to a signal distribution assembly, wherein: the base portion is a first base portion; the first base portion, the first post and the second post are included in a first portion of the metal layer; and the metal layer further includes a second portion having: a second base portion; and a third post extending from the second base portion, an upper surface of the third post being coupled being exposed through the molding compound.

In some aspects, the techniques described herein relate to a signal distribution assembly, wherein: the first portion of the metal layer further includes: a fourth post extending from the first base portion, an upper surface of the fourth post being exposed through the molding compound; and a fifth post extending from the first base portion, an upper surface of the fourth post being exposed through the molding compound; and the second portion of the metal layer further includes a sixth post extending from the second base portion, an upper surface of the sixth post being exposed through the molding compound.

In some aspects, the techniques described herein relate to a signal distribution assembly configured to conduct signals in a semiconductor device module, the signal distribution assembly including: a first metal layer, the first metal layer having: a first side, the first side being planar; and a second side opposite the first side, the second side being non-planar and including: a base portion; a first post extending from the base portion; and a second post extending from the base portion; and a thermally conductive insulator layer, a first surface of the thermally conductive insulator layer being coupled with the first side of the first metal layer; and a second metal layer coupled with a second surface of the thermally conductive insulator layer opposite the first surface of the thermally conductive insulator layer.

In some aspects, the techniques described herein relate to a signal distribution assembly, wherein: the base portion is a first base portion; the first base portion, the first post and the second post are included in a first portion of the first metal layer; and the first metal layer further includes a second portion having: a second base portion; and a third post extending from the second base portion.

Figure 1A:
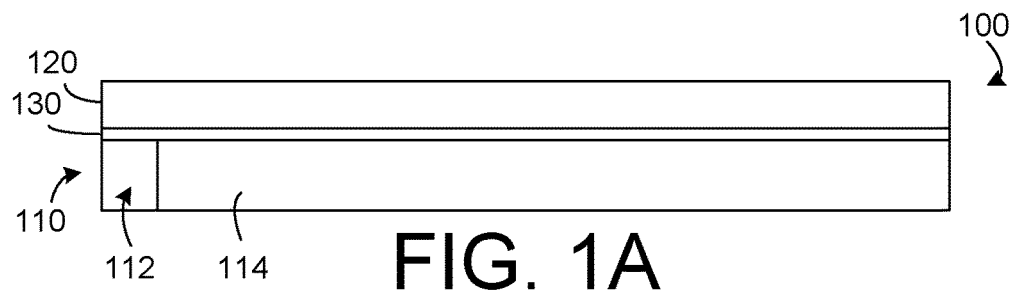
FIG. 1A is a diagram schematically illustrating a side view of a signal distribution assembly.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated.

DETAILED DESCRIPTION

This disclosure relates to implementations of semiconductor device assemblies including signal distribution assemblies (e.g., electrical interconnection appliances, or structures) that can improve thermal performance and reduce mechanical stresses in such assemblies, e.g., power transistor assemblies. For instance, in some implementations, a power transistor assembly can include a pre-molded electrical interconnect structure, or signal distribution assembly, where contact surfaces (of conductive posts for contacting semiconductor die and/or portions of a leadframe) are exposed through a molding compound that is used to pre-mold the structure. The pre-molded structure can then be coupled with a thermally conductive ceramic layer (e.g., using a thermally conductive adhesive, such as an epoxy). Such implementations can be referred to as substrate bonded ceramic (SBC) assemblies.

In some implementations, a signal distribution assembly with a metal-insulator-metal (MIM) stacked structure can be used, which can be referred to as MIM assemblies. As compared with SBC assemblies, MIM assemblies can exclude a molding compound, e.g., may not be pre-molded. Such signal distribution structures (e.g., SBC structures and/or MIM structures), as shown in the semiconductor device assemblies described herein, can improve thermal performance (reduce thermal resistance) by allowing for dual-sided cooling, which increases (e.g., can approximately double) heat spreading area as compared to current device assemblies with single-sided cooling. The implementations described herein can also achieve shorter thermal (and electrical) conduction paths (e.g., by, in part, eliminating use of conductive spacers), which also improves thermal performance (e.g., reduces thermal resistance), as well as improved mechanical performance, e.g., reduced mechanical stresses on the semiconductor die stress, as well as improved solder joint reliability due to mechanical flexibility of the disclosed SBC structures and MIM structures. As compared to current implementations of a power transistor assemblies for use in, e.g., electrical vehicle (EV) and/or hybrid-electric vehicle (HEV) electrical inverter applications, the approaches described herein can reduce thermal resistance (e.g., junction-to-case and/or junction-to-sink thermal resistance) by 19% to 36%. Further the approaches described herein, as compared to current approaches, can reduce die tensile stress by 10-13%, which can reduce occurrence of die cracking, and also can improve die top solder joint reliability by 19-40%, e.g., as a result of reducing die top strain density.

FIG. 1A is a diagram schematically illustrating a side view of a signal distribution assembly 100. The example of FIG. 1A can be referred to as a SBC structure, such as described above. As shown in FIG. 1A, the signal distribution assembly 100 includes a pre-molded signal distribution assembly 110, a ceramic layer 120 and an adhesive 130. The pre-molded signal distribution assembly 110 can include a metal layer 112 and a molding compound 114 that is used to pre-mold the metal layer 112. The metal layer 112 is shown in FIG. 1A for purposes of illustration (and context). In some implementations the metal layer 112 may not be visible in the view shown in FIG. 1A, as being obscured by the molding compound 114.

In this example, the molding compound 114 can provide mechanical stability to the metal layer 112 (which can be less than 1 millimeter thick), while still allowing sufficient mechanical flexibility to reduce the occurrence of stresses within an associated semiconductor device assembly including the signal distribution assembly 100. The ceramic layer 120 can be a thermally conductive, and electrically insulative layer, such as aluminum oxide ($Al_2O_3$), aluminum nitride (AlN), silicon nitride $Si_3N_4$, or a resin, such as polyimide, as some examples. The adhesive 130 can be used to couple the ceramic layer 120 to the pre-molded signal distribution assembly 110. In some examples, the adhesive 130 can be a thermally conductive and electrically conductive epoxy, such as a silver-filled epoxy, as one example. In other implementations, the adhesive 130 can be a thermally conductive, but electrically insulative adhesive material, e.g., a thermal interface material.

Figure 1B:
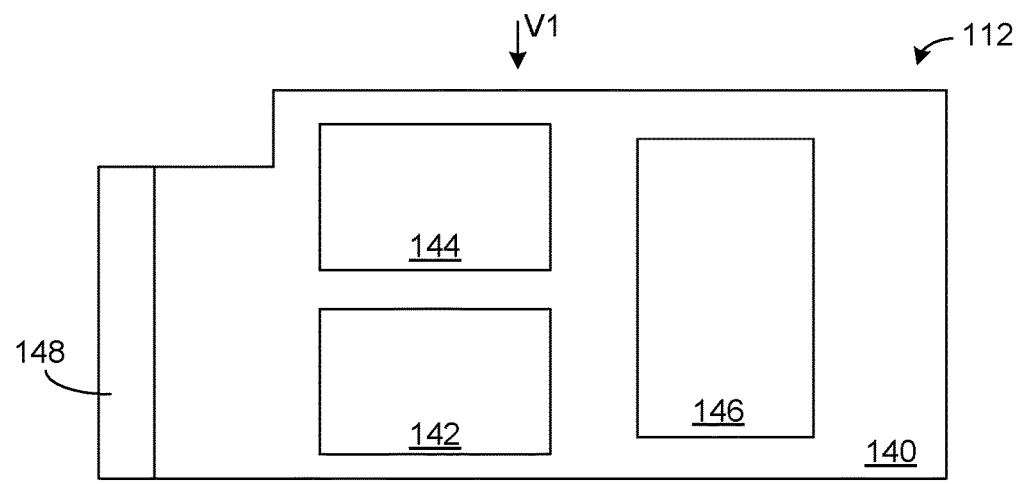
FIG. 1B is a diagram illustrating a plan view (e.g., bottom-side plan view) of a signal distribution portion of the assembly of FIG. 1A.

FIG. 1B is a diagram illustrating a plan view (e.g., bottom-side plan view) of a signal distribution portion (e.g., the metal layer 112) of the assembly 100 of FIG. 1A. As shown in FIG. 1B, the metal layer 112, in this example, includes a base portion 140, a post 142, a post 144, a post 146 and a post 148, where each of the posts 142-148 extends away (e.g., out of the page) from the base portion 140, such as is further illustrated in, at least, FIG. 1C.

As can be seen from a comparison of FIG. 1A and FIG. 1B, the portion of the metal layer 112 shown in FIG. 1A (e.g., exposed through the molding compound 114) corresponds with the post 148. In some implementations, the metal layer 112 can be formed from a metal sheet, where etching or other process can be performed on the metal sheet to form the base portion 140 and the posts 142-148. In some implementations, the metal layer 112 can be formed using one or more deposition processes, and/or sputtering processes. In some implementations, the metal layer 112 can be formed from copper, aluminum-copper, copper-molybdenum, and/or one or more other electrically conductive materials. In this example, the metal layer 112 is monolithic. In other words, the base portion 140 and the posts 142-148 are included a unitary structure, which can eliminate the use of electrically conductive spacers and, as a result, reduce the reliability issues associated with such spacers.

Figure 1C:
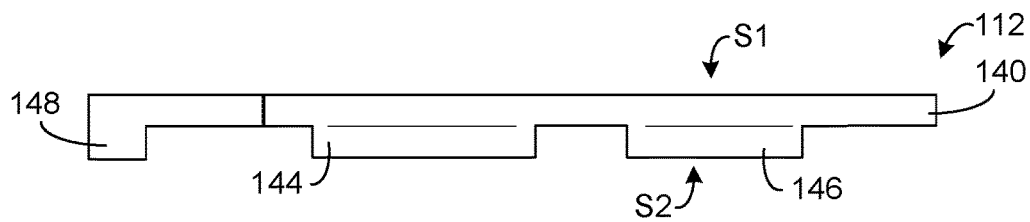
FIG. 1C is a diagram illustrating a side view of the signal distribution portion of FIG. 1B.

FIG. 1C is a diagram illustrating a side view of the metal layer 112 of FIG. 1B. In this example, the metal layer 112 is viewed along the direction V1 shown in FIG. 1B. In the view shown in FIG. 1C, the post 144, the post 146 and the post 148 are shown as extending away from the base portion 140. As also shown in FIG. 1C, the metal layer 112 has a first side S1 and a second side S2. In this example, the side S1 is planar, which facilitates coupling the pre-molded signal distribution assembly 110 with the ceramic layer 120 (e.g., using the adhesive 130) to produce the signal distribution assembly 100. Further in this example, the side S2 is non-planar, with the posts 142-148 extending away from the base portion 140.

Figure 1D:
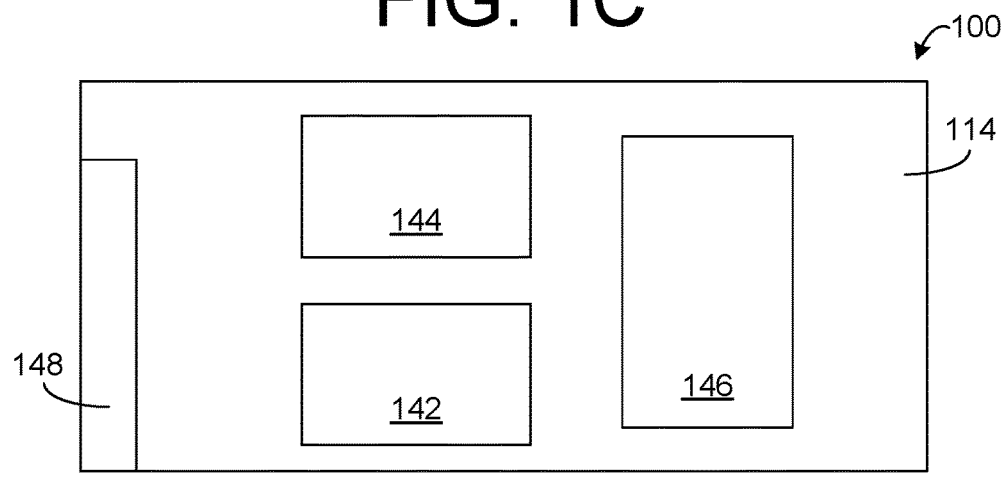
FIG. 1D is a diagram illustrating the signal distribution portion of FIG. 1B after pre-molding.

FIG. 1D is a diagram illustrating a plan-view the metal layer 112 of FIG. 1B after pre-molding with the molding compound 114 and attaching the ceramic layer 120 to form the pre-molded signal distribution assembly 100 of FIG. 1A.

In an example implementation, the metal layer 112 can be placed (and/or formed) in a molding jig, and then a transfer molding process (or other molding encapsulation process) can be performed to apply the molding compound 114 to the side S2 of the metal layer 112. As shown in FIG. 1D, after this molding process, respective upper surfaces of the posts 142-148 are exposed through the molding compound 114, e.g., using film assisted molding technology. In some implementations, these upper surfaces can be exposed by controlling a volume of the molding compound 114 applied to the side S2 of the metal layer 112, such that the upper surfaces of the posts are not encapsulated in the molding compound 114. In other implementations, a grinding process can be performed to expose the upper surfaces of the posts 142-148 through the molding compound 114 after the molding process.

Figure 3:
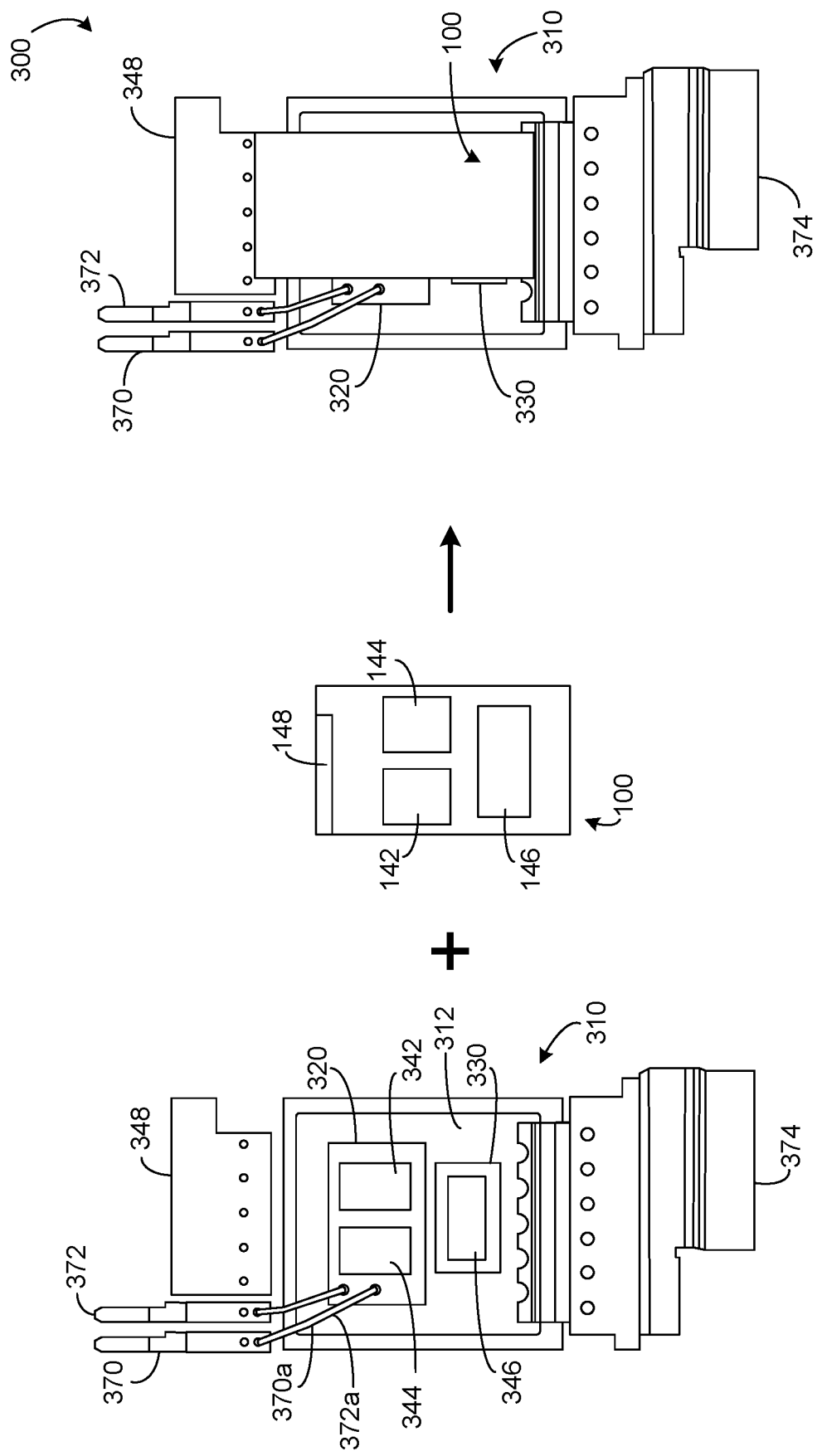
FIG. 3 is a diagram illustrating a portion of a method for a producing a semiconductor device module including the pre-molded signal distribution assembly of FIG. 1D.

In an example implementation, the signal distribution assembly 100 can be included in a power transistor device assembly including a power transistor, such as an insulated-gate bipolar transistor (IGBT) or a metal-oxide-semiconductor field-effect transistor (MOSFET), and a fast-recovery diode (FRD). Depending on the particular implementation, the power transistor and/or the FRD can be implemented in silicon, silicon carbide, gallium nitride, gallium arsenide, or any appropriate semiconductor material. In some implementations, the exposed surfaces of the post 142 and the post 144 can be coupled with the power transistor, e.g. with a collector terminal of an IGBT or a source terminal of a MOSFET. Further, an exposed surface of the post 146 can be coupled with a cathode terminal of the FRD, such that the metal layer 112 electrically couples the power transistor (emitter or source) with the FRD (cathode). Still further, the post 148 can be coupled with a signal blade (signal terminal, signal lead, etc.) of a leadframe included in the corresponding power transistor assembly. Such an example is illustrated in FIG. 3.

In some implementations, the arrangement of posts on the base portion 140, as well as shape and dimensions of the base portion 140, can vary. As an example, in some implementations, a single post (e.g., larger post) can replace the posts 142 and 144.

Figure 1E:
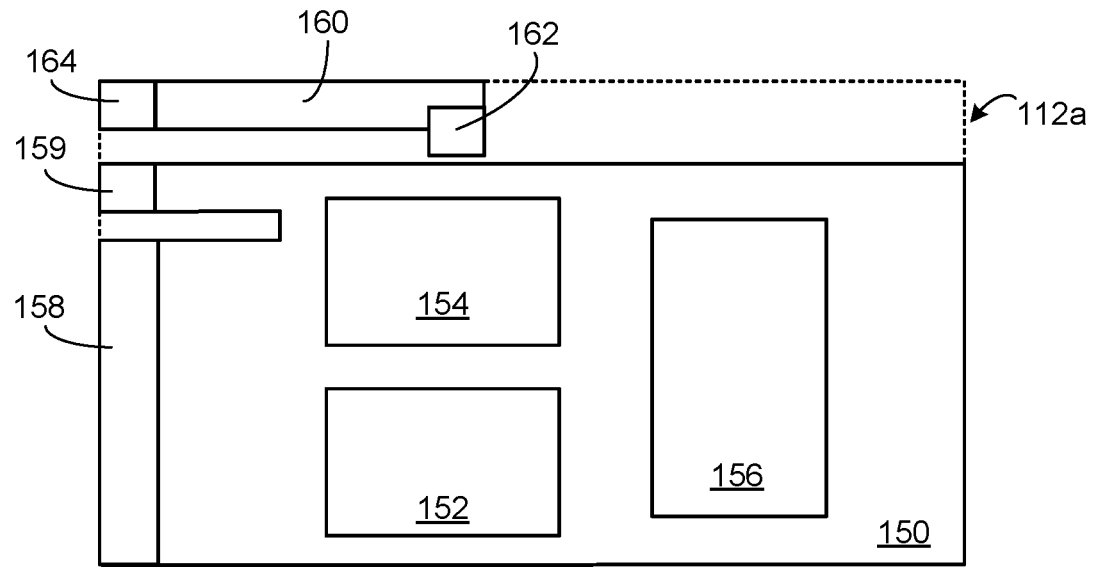
FIG. 1E is a diagram illustrating a plan view (e.g., bottom-side plan view) of another signal distribution portion of a signal distribution assembly.

FIG. 1E is a diagram illustrating a plan view (e.g., bottom-side plan view) of another signal distribution portion (e.g., a metal layer 112a) of an SBC structure. As shown in FIG. 1E, the metal layer 112a, similar to the metal layer 112 of FIGS. 1A-1D, includes (e.g. monolithically) a base portion 150, a post 152, a post 154, a post 156, a post 158, and a post 159, where each of the posts 152-159 extends away (e.g., out of the page) from the base portion 150, similar to the posts 142-148 of the metal layer 112. The metal layer 112a also includes a base portion 160, a post 162 and a post 164, which are physically separate, and electrically isolated from the base portion 150, and the posts 152-159, and can also be monolithic. That is, as shown in FIG. 1E, the base portion 150 and the posts 152-159 are included in a first portion of the metal layer 112a, while the base portion 160 and the posts 162-164 are included in a second portion of the metal layer 112a.

Figure 1F:
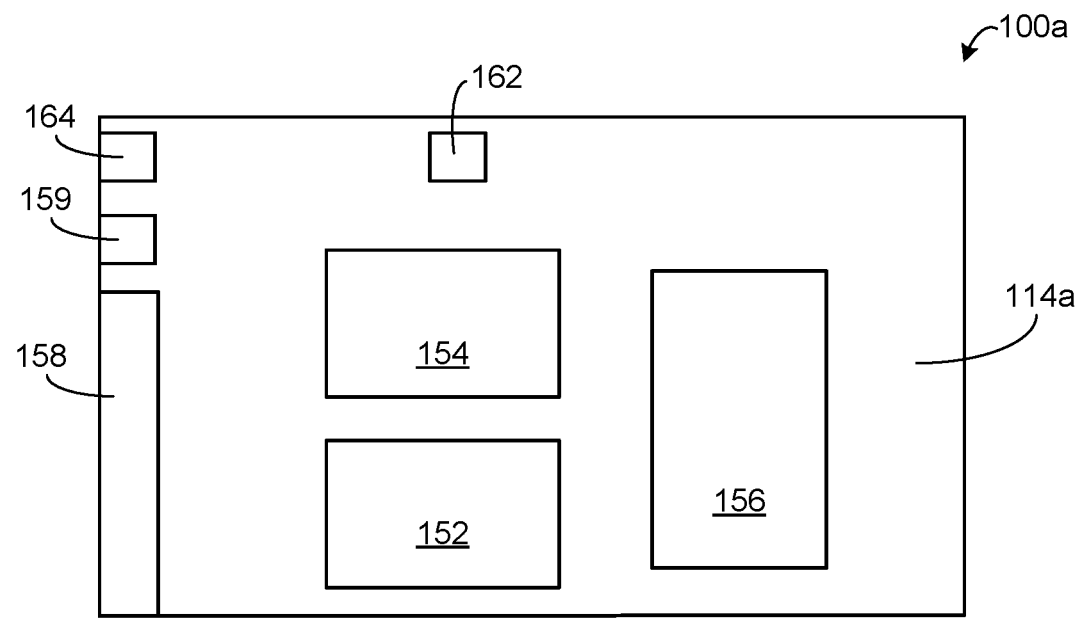
FIG. 1F is a diagram illustrating the signal distribution portion of FIG. 1B after pre-molding.

FIG. 1F is a diagram illustrating the metal layer 112a of FIG. 1E after pre-molding with a molding compound 114a and attachment of a ceramic layer (such as the ceramic layer 120) to form the signal distribution assembly 100 (e.g., an SBC structure) similar to the signal distribution assembly 100 of FIG. 1A. In an example implementation, the metal layer 112a can be placed (and/or formed) in a molding jig, and then a transfer molding process (or other molding encapsulation process) can be performed to apply the molding compound 114a to a side of the metal layer 112 including the posts 152-159 and the posts 162-164 (e.g., covering the visible parts of the base portion 150 and base portion 160, e.g., using film assisted molding. As shown in FIG. 1F, after this molding process, respective upper surfaces of the posts 152-159 and the posts 162-164 are exposed through the molding compound 114a. In some implementations, these upper surfaces can be exposed by controlling a volume of the molding compound 114a applied, such that the upper surfaces are not encapsulated in the molding compound 114a. In other implementations, a grinding process can be performed to expose the upper surfaces of the posts 152-159 and the posts 162-164 through the molding compound 114a after the molding process.

Figure 4:
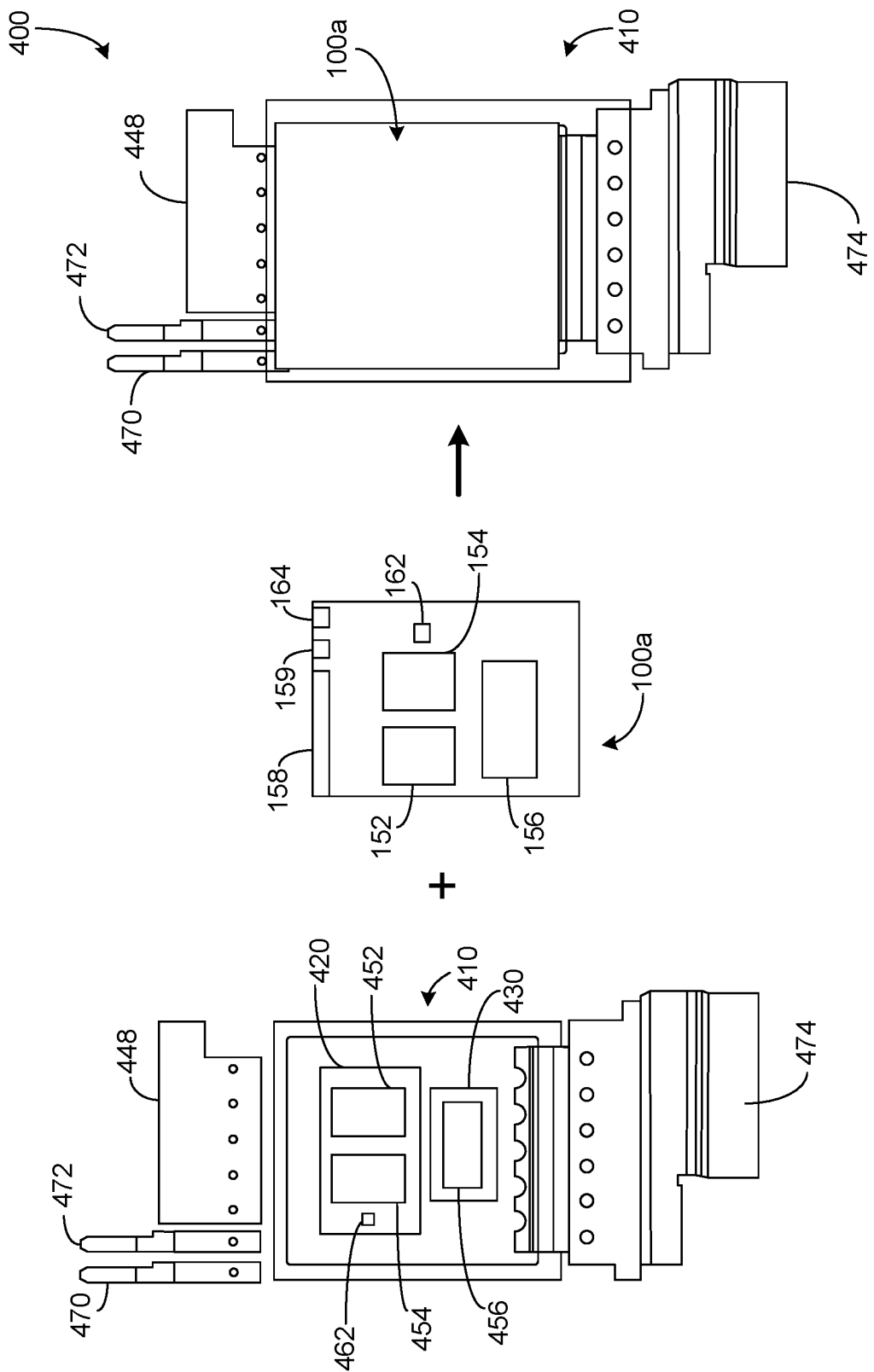
FIG. 4 is a diagram illustrating a portion of a method for a producing a semiconductor device module including the pre-molded signal distribution assembly of FIG. 1F.

In an example implementation, the signal distribution assembly 100a can be included in a power transistor device assembly including a power transistor, such as an IGBT or a MOSFET, and a FRD. Depending on the particular implementation, the power transistor and/or the diode can be implemented in silicon, silicon carbide, gallium nitride, gallium arsenide, or any appropriate semiconductor material. In an example implementation, the exposed surfaces of the post 152 and the post 154 can be coupled with the power transistor, e.g. with a collector terminal of an IGBT or a source terminal of a MOSFET. Further, the post 156 can be coupled with a cathode terminal of the FRD, and the metal layer 112a can electrically couple the power transistor (emitter or source) with the FRD (cathode). Still further, the post 158 can be coupled with a signal blade (signal terminal, signal lead, etc.) of a leadframe included in the corresponding power transistor assembly, and the post 159 can be coupled with a thermal sense signal pin of the leadframe. Also, the post 162 can be coupled with a gate terminal of the corresponding power transistor semiconductor die, and the post 164 can be coupled with a gate signal pin of the leadframe. Such an example is illustrated in FIG. 4.

In some implementations, the arrangement of respective posts on the base portion 150 and the base portion 160, as well as respective shapes and dimensions of the base portion 150 and the base portion 160, can vary. As an example, in some implementations, the base portion 160 may be a straight metal trace, can include additional corners, or bends to route a gate signal from the corresponding signal pin of an associated leadframe to a gate pad on the semiconductor die including an associated power transistor, as is appropriate for the particular implementation.

Figure 2A:
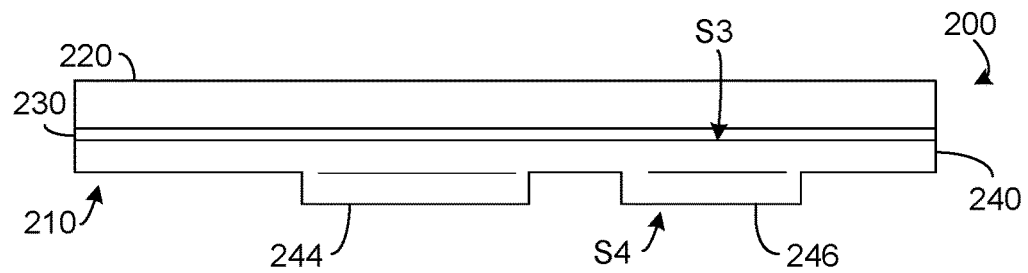
FIG. 2A is a diagram illustrating a side view of another signal distribution assembly.

FIG. 2A is a diagram schematically illustrating a side view of a signal distribution assembly 200. The example of FIG. 2A can be referred to as a MIM structure, such as described above. As shown in FIG. 2A, the signal distribution assembly 200 includes a metal layer 210, a metal layer 220 and an insulator layer 230. In some implementations, the metal layer 210 and the metal layer 220 can be coupled to respective sides of the insulator layer 230 using active metal brazing (AMB), sintering, plating, etc. As compared with pre-molded signal distribution assembly 110 and the metal layer 112, the metal layer 210 exclude pre-molding. In this example, structural support for the 210 (and the metal layer 220) is provided by the insulator layer 230, while still allowing sufficient mechanical flexibility to reduce the occurrence of stresses within an associated semiconductor device assembly including the signal distribution assembly 200. The insulator layer 230 can be a thermally conductive, and electrically insulative layer, such as tetraethyl orthosilicate (TEOS) . . . can be a thermally conductive, and electrically insulative layer, such as aluminum oxide ($Al_2O_3$), aluminum nitride (AlN), silicon nitride $Si_3N_4$, silicon dioxide ($SiO_2$), a resin, such as polyimide, or an epoxy, as some examples.

Figure 2B:
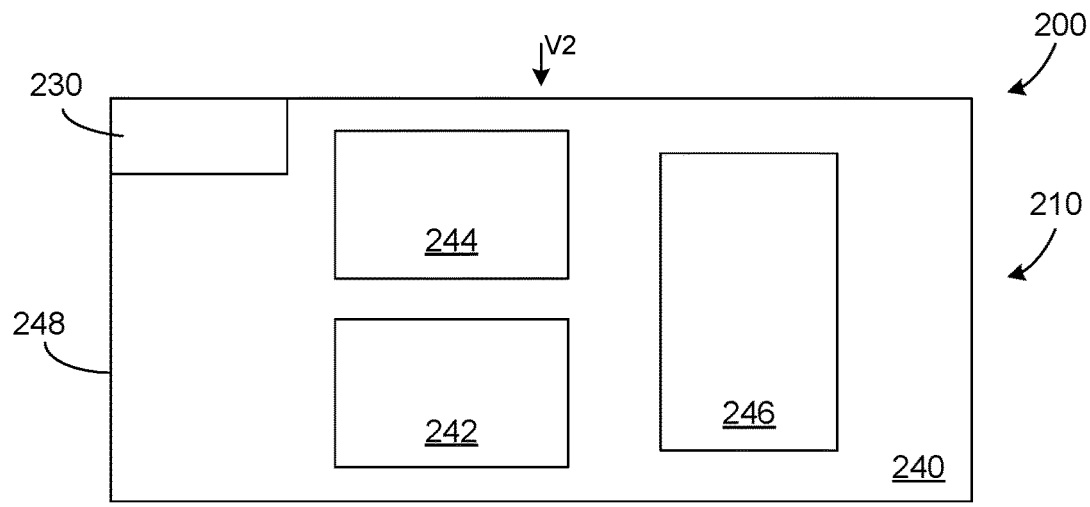
FIG. 2B is a diagram illustrating a plan view (e.g., bottom-side plan view) of a signal distribution assembly of FIG. 2A.

In this example, FIG. 2A, with further reference to FIG. 2B, is a diagram illustrating a side view of the signal distribution assembly 200 viewed along the direction V2 shown in FIG. 2B. In the view shown in FIG. 2A, the post 244 and the post 246 are shown as extending away from the base portion 240. As also shown in FIG. 2A, the metal layer 210 has a first side S3 and a second side S3. In this example, the side S3 is planar, which can facilitate coupling the metal layer 210 with the insulator layer 230. Further in this example, the side S4 of the metal layer 210 is non-planar, with, as shown in FIG. 2B, post 242 and post 248 extending away from the base portion 240, e.g., out of the paper in FIG. 2B.

FIG. 2B is a diagram illustrating a plan view (e.g., bottom-side plan view) of the signal distribution assembly 200 of FIG. 2A. As shown in FIG. 2B, the side S4 of the metal layer 210, in this example, includes the base portion 240, and the posts 242-246, where each of the posts 242-246 extends away (e.g., out of the page) from the base portion 240.

In some implementations, the metal layer 210 can be formed from a metal sheet, where etching or other process can be performed on the metal sheet to form the base portion 240 and the posts 242-246. In some implementations, the metal layer 210 can be formed using one or more deposition processes, and/or sputtering processes. In some implementations, the metal layer 210 can be formed from copper, aluminum-copper, copper-molybdenum, and/or one or more other electrically conductive materials. In this example, the metal layer 210 is monolithic. In other words, the base portion 240 and the posts 242-246 are included a unitary structure, which can eliminate the use of electrically conductive spacers and, as a result, reduce the reliability issues associated with such spacers.

In an example implementation, the signal distribution assembly 200 can be included in a power transistor device assembly including a power transistor, such as an insulated-gate bipolar transistor (IGBT) or a metal-oxide-semiconductor field-effect transistor (MOSFET), and a fast-recovery diode (FRD). Depending on the particular implementation, the power transistor and/or the FRD can be implemented in silicon, silicon carbide, gallium nitride, gallium arsenide, or any appropriate semiconductor material. In some implementations, respective upper surfaces of the post 242 and the post 244 (e.g., the surfaces shown in FIG. 2B) can be coupled with the power transistor, e.g. with a collector terminal of an IGBT or a source terminal of a MOSFET. Further, an upper surface of the post 246 (e.g., the surface shown in FIG. 2B) can be coupled with a cathode terminal of the FRD, such that the metal layer 210 electrically couples the power transistor (emitter or source) with the FRD (cathode). Still further, the base portion 240 can be coupled, e.g., near an edge 248, with a signal blade (signal terminal, signal lead, etc.) of a leadframe included in the corresponding power transistor assembly. Such an example is similar to the implementation of FIG. 3.

In some implementations, the arrangement of posts on the base portion 240, as well as shape and dimensions of the base portion 240, can vary. As an example, in some implementations, a single post (e.g., larger post) can replace the posts 242 and 244 and/or the size and shape of the base layer 240 can be changed.

Figure 2C:
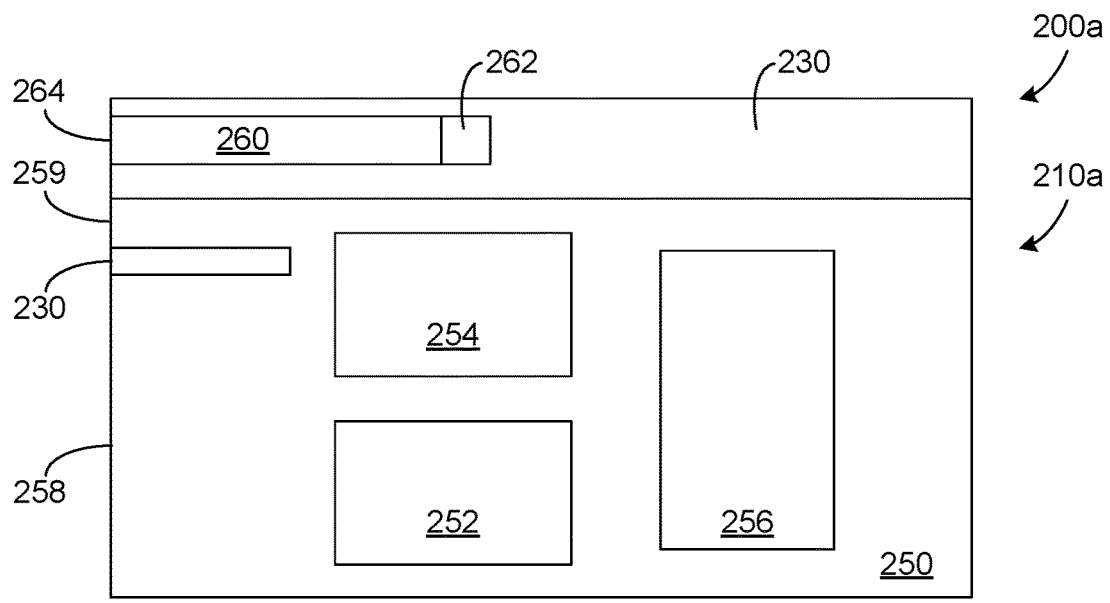
FIG. 2C is a diagram illustrating a plan view (e.g., bottom-side plan view) of another signal distribution assembly.

FIG. 2C is a diagram illustrating a plan view (e.g., bottom-side plan view) of another signal distribution assembly 200a. As shown in FIG. 2C, a metal layer 210a, (which is similar to, and could be implemented in place of the metal layer 210 of FIGS. 2A and 2B), includes a base portion 250, a post 252, a post 254, and a post 256, where each of the posts 252-256 extends away (e.g., out of the page) from the base portion 250. The metal layer 210a also includes a base portion 260, and a post 262, which are physically separate, and electrically isolated from the base portion 250, and the posts 252-256. That is, as shown in FIG. 2C, the base portion 250 and the posts 252-256 are included in a first portion of the metal layer 210, while the base portion 260 and the post 262 are included in a second portion of the metal layer 210a.

In an example implementation, the signal distribution assembly 200a can be included in a power transistor device assembly including a power transistor, such as an insulated-gate bipolar transistor (IGBT) or a metal-oxide-semiconductor field-effect transistor (MOSFET), and a fast-recovery diode (FRD). Depending on the particular implementation, the power transistor and/or the FRD can be implemented in silicon, silicon carbide, gallium nitride, gallium arsenide, or any appropriate semiconductor material. In some implementations, respective upper surfaces of the post 252 and the post 254 (e.g., the surfaces shown in FIG. 2C) can be coupled with the power transistor, e.g. with a collector terminal of an IGBT or a source terminal of a MOSFET. Further, an upper surface of the post 256 (e.g., the surface shown in FIG. 2C) can be coupled with a cathode terminal of the FRD, such that the metal layer 210a electrically couples the power transistor (emitter or source) with the FRD (cathode). Still further, the base portion 250 can be coupled, e.g., near an edge 258, with a signal blade (signal terminal, signal lead, etc.) of a leadframe included in the corresponding power transistor assembly, and also coupled, e.g., near and edge 259, with a thermal sense signal pin of the leadframe. Also, the post 262 can be coupled with a gate terminal of the corresponding power transistor semiconductor die, and the base portion 260, e.g., near and edge 264, can be coupled with a gate signal pin of the leadframe. Such an example is similar to the implementation illustrated in FIG. 4.

In some implementations, the arrangement of respective posts on the base portion 250 and the base portion 260, as well as respective shapes and dimensions of the base portion 250 and the base portion 260, can vary. As an example, in some implementations, the base portion 260 may not be a straight metal trace, but rather may include corners, or bends to route a gate signal from the corresponding signal pin of an associated leadframe to a gate pad on the semiconductor die including an associated power transistor.

FIG. 3 is a flow diagram illustrating a portion of a method for a producing a semiconductor device module 300 including the signal distribution assembly 100 of FIG. 1D. A similar flow can be used to produce a semiconductor device module using the signal distribution assembly 200 of FIGS. 2A and 2B in place of the signal distribution assembly 100. For purposes of brevity, that flow (e.g., for the signal distribution assembly 200) is not shown here.

In this example, referring first to the left portion of FIG. 3, the semiconductor device module 300 can include a substrate 310, which can be a DBM substrate. The substrate 310 can include a top metal layer 312, which can be a copper layer, or other metal layer. As shown in FIG. 3, a semiconductor die 320 and a semiconductor die 330 can be coupled with the top metal layer 312 of the substrate 310, e.g., via a soldering reflow process, a sintering process, or other appropriate process. A blade signal terminal 374 (of a leadframe) can also be coupled with the top metal layer 312 using the same process operations (solder, sinter, etc.) used to attach the semiconductor die 320 and the semiconductor die 330 to the top metal layer 312.

In this example, the semiconductor die 320 can include a power transistor, such as an IGBT or a MOSFET, and the semiconductor die 330 can include a FRD. In this example, the top metal layer 312 of the substrate 310, as well as the blade signal terminal 374, are electrically coupled with a collector terminal (for an IGBT included in the semiconductor die 320) or a drain terminal (for a MOSFET included in the semiconductor die 320), as well as anode for the FRD included in the semiconductor die 330. That is, the top metal layer 312 electrically couples both the power transistor (collector or drain) and the FRD (anode) with the blade signal terminal 374.

As further shown in FIG. 3, a solder print or dispense operation can be performed to form a solder portion 342, a solder portion 344, and a solder portion 346, which respectively correspond with the posts 142-146 of the signal distribution assembly 100. That is, the signal distribution assembly 100 can be flipped and placed on the solder portions 342-346, such that the posts 142-146 align with their respective solder portions. Further, the post 148 of the signal distribution assembly 100 can align with a corresponding solder portion (not shown in FIG. 3) that is disposed on a blade terminal 348 (of the leadframe). A solder reflow process can then be performed to couple the signal distribution assembly 100 to the semiconductor die 320, the semiconductor die 330 and the blade terminal 348 (via the respective posts of the signal distribution assembly 100).

As also shown in FIG. 3, the leadframe of the semiconductor device module 300 can also include a signal pin 370 (e.g., a gate signal pin) and a signal pin 372 (e.g., a thermal sense signal pin), which can be coupled with the semiconductor die 320, respectively, via a wire bond 370a and a wire bond 372a.

FIG. 4 is a flow diagram illustrating a portion of a method for a producing a semiconductor device module 400 including the signal distribution assembly 100a of FIG. 1F. A similar flow can be used to produce a semiconductor device module using the signal distribution assembly 200a of FIG. 2C in place of the signal distribution assembly 100a. For purposes of brevity, that flow (e.g., for the signal distribution assembly 200a) is not shown here.

In this example, referring first to the left portion of FIG. 4, the semiconductor device module 400 can include a substrate 410, which can be a DBM substrate. The substrate 410 can include a top metal layer 412, which can be a copper layer, or other metal layer. As shown in FIG. 4, a semiconductor die 420 and a semiconductor die 430 can be coupled with the top metal layer 412 of the substrate 410, e.g., via a soldering reflow process, a sintering process, or other appropriate process. A blade signal terminal 474 (of a leadframe) can also be coupled with the top metal layer 412 using the same process operations (solder, sinter, etc.) used to attach the semiconductor die 420 and the semiconductor die 430 to the top metal layer 412.

In this example, the semiconductor die 420 can include a power transistor, such as an IGBT or a MOSFET, and the semiconductor die 430 can include a FRD. In this example, the top metal layer 412 of the substrate 410, as well as the blade signal terminal 474, are electrically coupled with a collector terminal (for an IGBT included in the semiconductor die 420) or a drain terminal (for a MOSFET included in the semiconductor die 420), as well as anode for the FRD included in the semiconductor die 430. That is, the top metal layer 412 electrically couples both the power transistor (collector or drain) and the FRD (anode) with the blade signal terminal 474.

As further shown in FIG. 4, a solder print or dispense operation can be performed to form a solder portion 452, a solder portion 454, a solder portion 456, and a solder portion 462, which respectively correspond with the posts 152, 154, 156 and 162 of the signal distribution assembly 100a. That is, the signal distribution assembly 100a can be flipped and placed on the solder portions 452, 454, 456 and 462, such that the posts 152, 154, 156 and 162 align with their respective solder portions. Further, the post 158 of the signal distribution assembly 100a can align with a corresponding solder portion (not shown in FIG. 4) that is disposed on a blade terminal 448. Still further, the posts 159 and 164 of the signal distribution assembly 100a can align with respective solder portions (not shown in FIG. 4) that are disposed on a signal pin 472 (e.g., a thermal sense signal pin) and a signal pin 472 (e.g., a gate signal pin) of the leadframe. A solder reflow process can then be performed to couple the signal distribution assembly 100a to the semiconductor die 420, the semiconductor die 430, the blade terminal 448, the signal pin 472 and the signal pin 470 (via the respective posts of the signal distribution assembly 100a). In this implementation, as compared to the implementation of FIG. 3, the wire bond 370a and the wire bond 372a are replaced by signal routing implemented in the signal distribution assembly 100a.

Figure 5A:
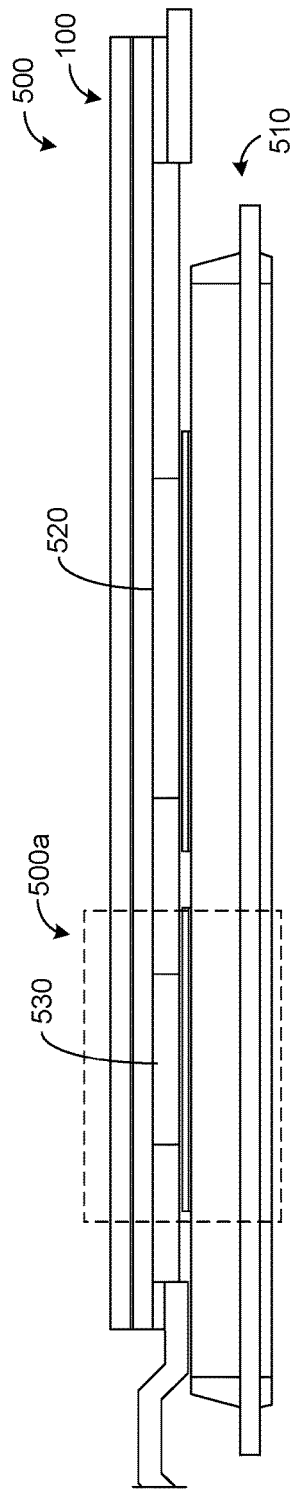
FIG. 5A is a side view of a semiconductor device module including a signal distribution assembly, such the assembly of FIG. 1A.
Figure 5B:
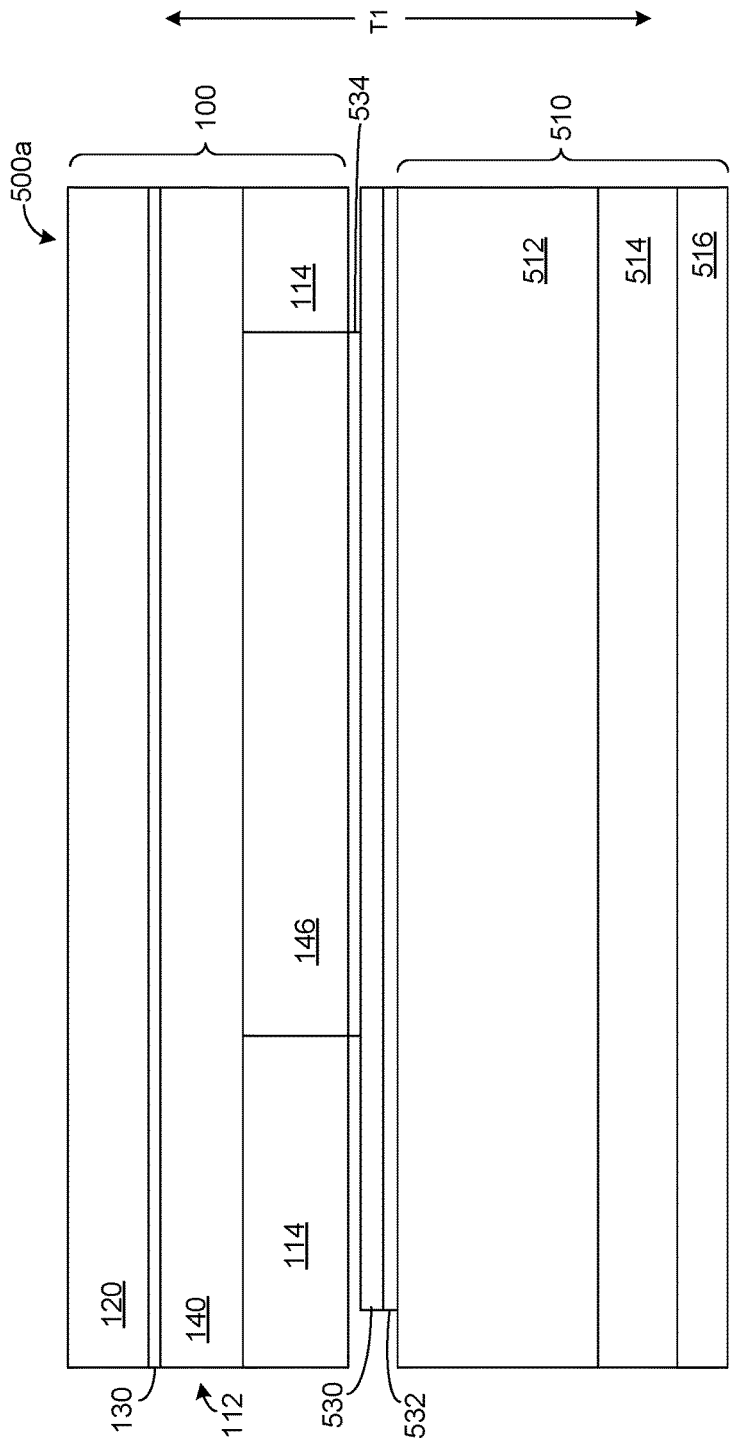
FIG. 5B is a magnified view of a portion of the semiconductor device module of FIG. 5A.

FIG. 5A is a side view (e.g., a cross-sectional view) of a semiconductor device module 500 including a signal distribution assembly (an SBC structure), such the signal distribution assembly 100 of FIGS. 1A and 1D. That is, for purposes of illustration, the semiconductor device module 500 is described as including the signal distribution assembly 100, though could include other signal distribution assembly implementations. In this example, the semiconductor device module 500 includes a substrate 510 (e.g., a DBM substrate), the signal distribution assembly 100, a semiconductor die 520 (e.g., including a power transistor) and a semiconductor die 530 (e.g., including a FRD). A dashed line 500a in FIG. 5A defines an inset 500a, for which a magnified view is shown in FIG. 5B. That is the inset 500a includes the arrangement of elements for the semiconductor device module 500 corresponding with the semiconductor die 530 (where the stack associated with the semiconductor die 520 would be the same or similar).

Referring to FIG. 5B, illustrating the magnified view of the inset 500a shown in FIG. 5A, the substrate 510 includes a metal layer 512 (e.g., top metal layer) a ceramic layer 514, and a metal layer 516 (e.g., bottom metal layer), which can be used for bottom-side cooling of the semiconductor device module 500. As also shown in FIG. 5B, and as described above, the signal distribution assembly 100 includes the metal layer 112, the molding compound 114, the ceramic layer 120 (which can be used for top-side cooling of the semiconductor device module 500), and the adhesive 130. In example of the inset 500a, the base portion 140 and the post 146 of the metal layer 112 are illustrated. As shown in FIG. 5B, the semiconductor die 530 is coupled with the metal layer 512 of the substrate 510 using a layer 532, which can be a solder layer or a sinter layer. Further as shown in FIG. 5B, the post 146 is coupled with the semiconductor die 530 using a layer 534, which can be a solder layer or sinter layer.

In a specific, non-limiting example, the elements of the semiconductor device module 500 shown in FIG. 5B can have thicknesses, along the line T1, as specified below. Of course, in other implementations, other thicknesses can be used, and the following discussion is provided by way of example and for purposes of illustration. For clarity, the example thickness (along the line T1) for each of the elements shown in FIG. 5B are listed, generally, from the top of the semiconductor device module 500 to the bottom of the semiconductor device module 500.

In this example, for the signal distribution assembly 100, the ceramic layer 120 can have a thickness of approximately 0.32 mm, the adhesive 130 can have a thickness of approximately 0.05 mm, and the metal layer 112 can have an overall thickness of approximately 0.70 mm, e.g., less than 1 mm. For the metal layer 112, the base portion 140 can have a thickness of approximately 0.35 mm and the post 146 can have a thickness (height from the base portion 140) of approximately 0.35 mm, e.g., both less than 0.5 mm. It is noted that the other posts of the metal layer 112 can have a same height. Further in this example, the molding compound 114 of the signal distribution assembly 100 can have a thickness of approximately 0.35 mm (or about a same thickness, or a slightly smaller thickness that the height of the post 146), so that the post 146 is exposed through the 114.

Still further in this example, the layer 534 can have a thickness of approximately 0.05 mm, the semiconductor die 530 can have a thickness of approximately 0.087 mm, and the layer 532 can have a thickness of approximately 0.05 mm. For the substrate 510 in this example, the metal layer 512 can have a thickness of approximately 0.8 mm, the ceramic layer 514 can have a thickness of approximately 0.32 mm, and the metal layer 516 can have a thickness of approximately 0.2 mm.

Figure 6A:
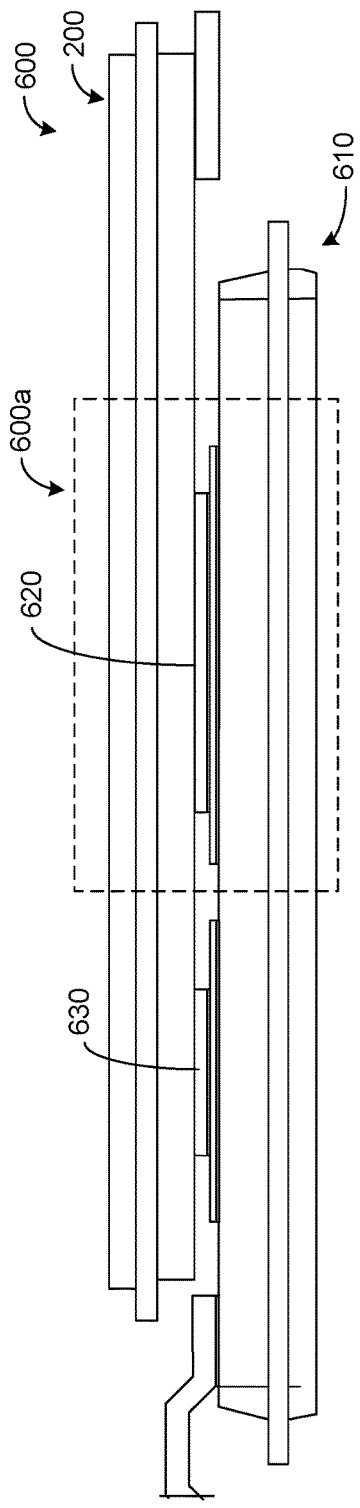
FIG. 6A is a side view of a semiconductor device module including a signal distribution assembly, such the assembly of FIG. 2A.
Figure 6B:
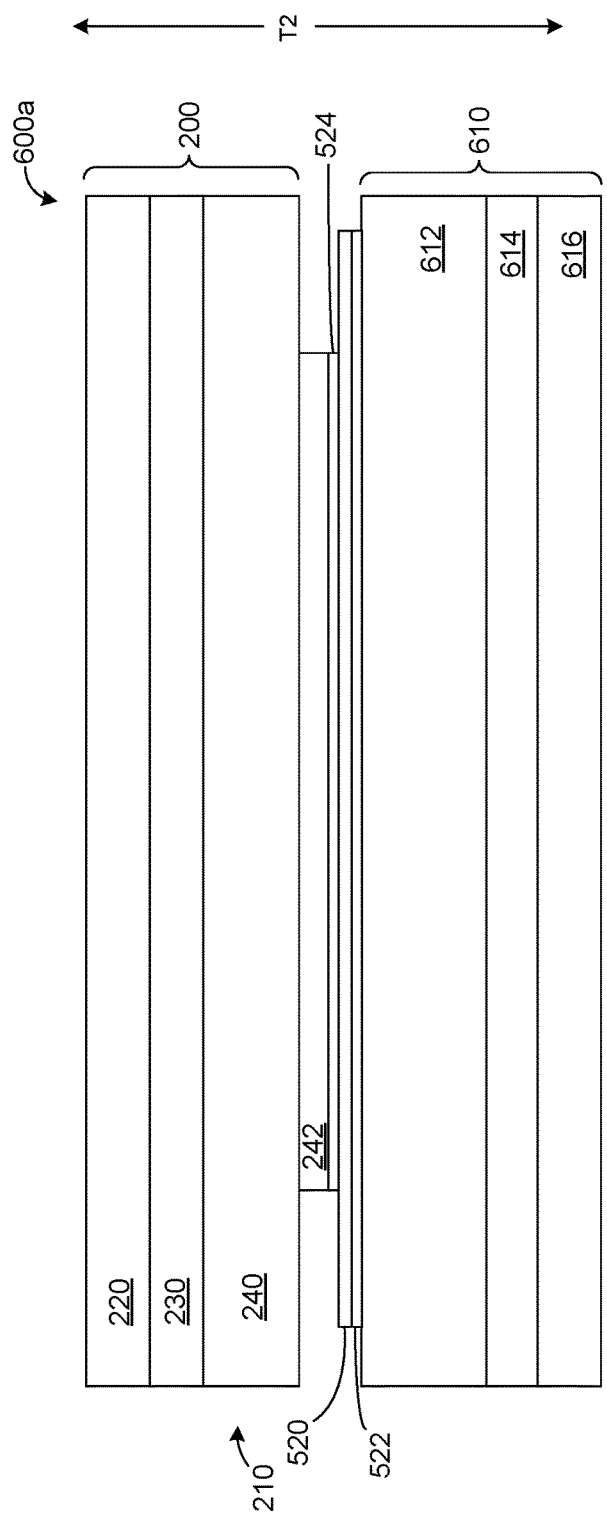
FIG. 6B is a magnified view of a portion of the semiconductor device module of FIG. 6A.

FIG. 6A is a side view (e.g., a cross-sectional view) of a semiconductor device module 600 including a signal distribution assembly (a MIM structure), such the signal distribution assembly 200 of FIGS. 2A and 2B. that is, for purposes of illustration, the semiconductor device module 600 is described as including the signal distribution assembly 200, though could include other signal distribution assembly implementations. In this example, the semiconductor device module 600 includes a substrate 610 (e.g., a DBM substrate), the signal distribution assembly 200, a semiconductor die 620 (e.g., including a power transistor) and a semiconductor die 630 (e.g., including a FRD). A dashed line 600a in FIG. 6A defines an inset 600a, for which a magnified view is shown in FIG. 6B. That is the inset 600a includes the arrangement of elements for the semiconductor device module 600 corresponding with the semiconductor die 620 (where the stack associated with the semiconductor die 620 would be the same or similar).

Referring to FIG. 6B, illustrating the magnified view of the inset 600a shown in FIG. 6A, the substrate 610 includes a metal layer 612 (e.g., top metal layer) a ceramic layer 614, and a metal layer 616 (e.g., bottom metal layer), which can be used for bottom-side cooling of the semiconductor device module 600. As also shown in FIG. 6B, and as described above, the signal distribution assembly 200 includes the metal layer 210, the insulator layer 230, and the metal layer 220 (which can be used for top-side cooling of the semiconductor device module 600). In example of the inset 600a, the base portion 240 and the post 242 of the metal layer 210 are illustrated. As shown in FIG. 6B, the semiconductor die 620 is coupled with the metal layer 612 of the substrate 610 using a layer 622, which can be a solder layer or a sinter layer. Further as shown in FIG. 6B, the post 242 is coupled with the semiconductor die 620 using a layer 624, which can be a solder layer or sinter layer.

In a specific, non-limiting example, the elements of the semiconductor device module 600 shown in FIG. 6B can have thicknesses, along the line T2, as specified below. Of course, in other implementations, other thicknesses can be used, and the following discussion is provided by way of example and for purposes of illustration. For clarity, the example thickness (along the line T2) for each of the elements shown in FIG. 6B are listed, generally, from the top of the semiconductor device module 600 to the bottom of the semiconductor device module 600.

In this example, for the signal distribution assembly 200, the metal layer 220 can have a thickness of approximately 0.62 mm, and the insulator layer 230 can have a thickness of approximately 0.05 mm. Further, the metal layer 210 can have an overall thickness of approximately 0.80 mm, e.g., less than 1 mm. For the metal layer 210, the base portion 240 can have a thickness of approximately 0.62 mm and the post 242 can have a thickness (height from the base portion 140) of approximately 0.18 mm. It is noted that the other posts of the metal layer 210 can have a same height.

Still further in this example, the layer 624 can have a thickness of approximately 0.05 mm, the semiconductor die 620 can have a thickness of approximately 0.087 mm, and the layer 622 can have a thickness of approximately 0.05 mm. For the substrate 610 in this example, the metal layer 612 can have a thickness of approximately 0.8 mm, the ceramic layer 614 can have a thickness of approximately 0.32 mm, and the metal layer 616 can have a thickness of approximately 0.4 mm.

Figure 7:
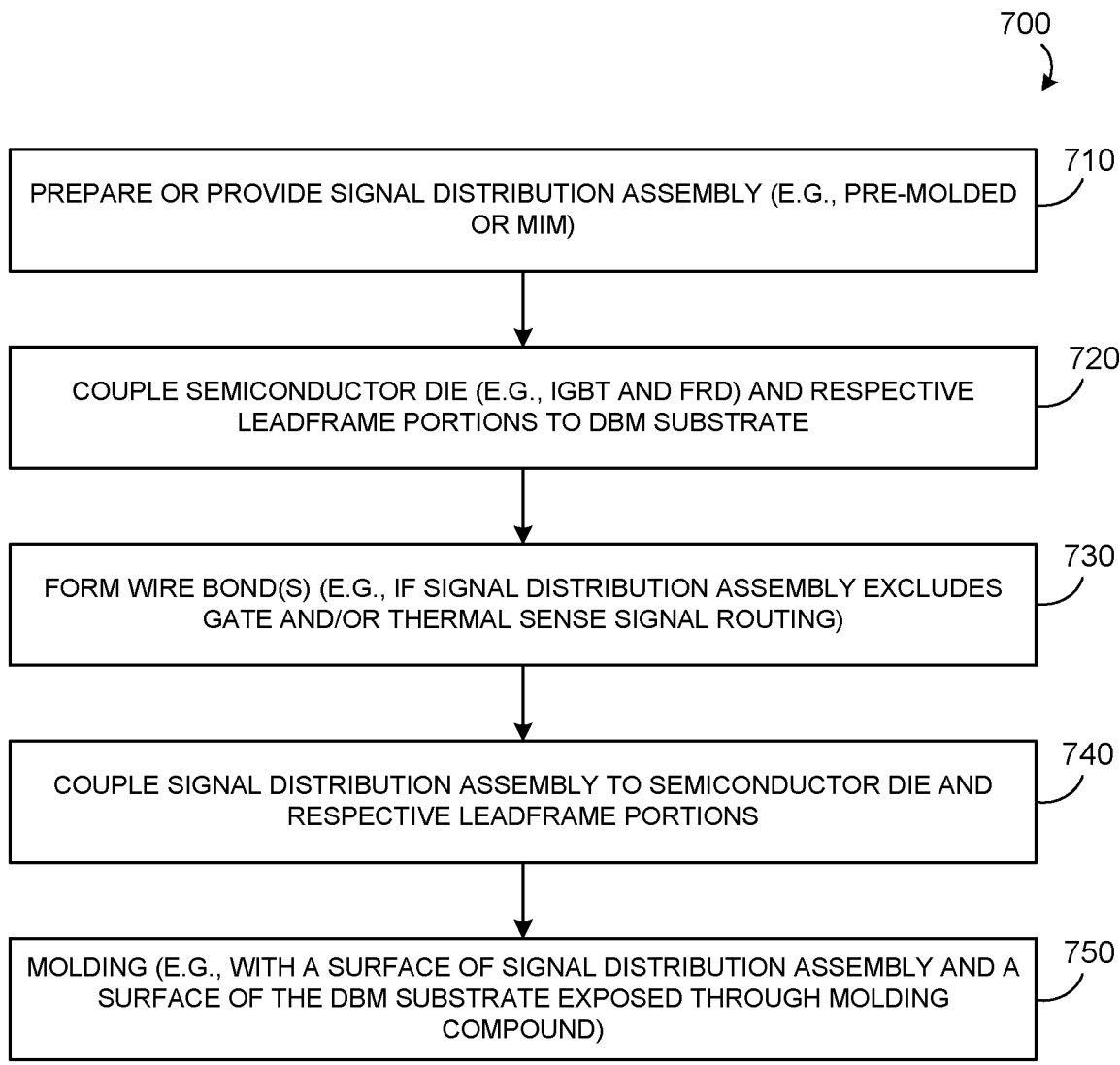
FIG. 7 is a flowchart illustrating a method for producing a semiconductor device module including a signal distribution assembly, such as the assemblies of FIG. 1A or FIG. 2A.

FIG. 7 is a flowchart illustrating a method 700 for producing a semiconductor device module including a signal distribution assembly, such as the assemblies of FIG. 1A or FIG. 2A. In the method 700, block 710 includes preparing or providing a signal distribution assembly, such as an SBC structure or a MIM structure, as those described herein with respect to FIGS. 1A-2C. At block 720, the method 700 includes coupling a power transistor (e.g., a collector terminal of an IGBT or a drain terminal of a MOSFET), a FRD (e.g., an anode terminal) and one or more leadframe portions to a substrate, such as on a metal layer of a DBM substrate as in the examples of FIGS. 3 and 4. At block 730, if signal distribution assembly excludes gate and/or thermal sense signal routing and/or associated conductive posts, the method 700 includes forming respective wire bond(s) to provide electrical connections from respective signal terminals (signal pins, etc.) of the leadframe to a gate terminal and/or a thermal sense terminal (e.g., on a surface of the power transistor semiconductor die). At block 740, the method 700 includes coupling the signal distribution assembly of block 710 to the semiconductor die and to one or more respective portions of the leadframe. In some implementations, the operation at block 720 can be done with a first solder and the operation at block 740 can be done with a second solder, where the second solder has a lower melting point than the first solder, e.g., to prevent unwanted reflow of solder used at block 720. In some implementations, the operations at blocks 720 and 740 can include sintering operations, such as silver sintering. At block 750, the method 700 includes encapsulating the produced semiconductor device assembly in a molding compound, where a surface of the signal distribution structure is exposed through a first surface of the molding compound and a surface of the substrate of block 720 is exposed through a second surface of the molding compound.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. For instance, features illustrated with respect to one implementation can, where appropriate, also be included in other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device module comprising:
   a substrate including:
      a first ceramic layer; and
      a first metal layer disposed on a first surface of the substrate; and
   a first semiconductor die, a first side of the first semiconductor die being coupled to the first metal layer;
   a second semiconductor die, a first side of the second semiconductor die being coupled to the first metal layer; and
   a signal distribution assembly including a second metal layer, the second metal layer having:
      a first side, the first side being planar; and
      a second side opposite the first side, the second side being non-planar and including:
         a base portion;
         a first post extending from the base portion, the first post being coupled with a second side of the first semiconductor die opposite the first side of the first semiconductor die; and
         a second post extending from the base portion, the second post being coupled with a second side of the second semiconductor die opposite the first side of the second semiconductor die, the signal distribution assembly electrically coupling the first semiconductor die with the second semiconductor die.

2. The semiconductor device module of claim 1, further comprising a second ceramic layer coupled with the first side of the second metal layer.

3. The semiconductor device module of claim 2, wherein the second ceramic layer is a thermally conductive ceramic layer that is coupled with the first side of the second metal layer via a thermally conductive epoxy adhesive.

4. The semiconductor device module of claim 1, wherein:
   the signal distribution assembly is pre-molded and includes a molding compound disposed on the second side of the second metal layer;
   a surface of the first post that is coupled with the first semiconductor die is exposed through the molding compound; and
   a surface of the second post that is coupled with the second semiconductor die is exposed through the molding compound.

5. The semiconductor device module of claim 1, further comprising:
   an insulator layer, a first surface of the insulator layer being coupled with the first side of the second metal layer; and
   a third metal layer coupled with a second surface of the insulator layer opposite the first surface of the insulator layer.

6. The semiconductor device module of claim 5, wherein the insulator layer electrically insulative and thermally conductive.

7. The semiconductor device module of claim 1, wherein:
   the second metal layer has an overall thickness of less than 1 millimeter (mm); and
   the first post and the second post have a same height of less than 0.5 mm.

8. The semiconductor device module of claim 7, wherein the same height is less than 0.2 mm.

9. The semiconductor device module of claim 1, wherein:
   the base portion is a first base portion;
   the first base portion, the first post and the second post are included in a first portion of the second metal layer; and
   the second metal layer further includes a second portion having:
      a second base portion; and
      a third post extending from the second base portion, the third post being coupled with the second side of the first semiconductor die.

10. The semiconductor device module of claim 9, wherein:
    the first semiconductor die is one of an insulated-gate bipolar transistor (IGBT) or a metal-oxide-silicon field-effect transistor (MOSFET);
    the second semiconductor die is a fast-recovery diode (FRD); and
    the first post being coupled with one of an emitter terminal of the IGBT, or with a source terminal of the MOSFET;
    the second post being coupled with a cathode of the FRD; and
    the third post being coupled with a gate terminal of the IGBT, or with a gate terminal of the MOSFET.

11. The semiconductor device module of claim 10, wherein the first portion of the second metal layer further includes a fourth post extending from the first base portion, the fourth post being coupled with a signal terminal of a leadframe of the semiconductor device module, the signal terminal being an emitter signal terminal, or a source signal terminal.

12. The semiconductor device module of claim 10, wherein the first portion of the second metal layer includes a fourth post extending from the first base portion, the fourth post being coupled with a thermal sense signal pin of a leadframe of the semiconductor device module.

13. The semiconductor device module of claim 10, wherein the second portion of the second metal layer includes a fourth post extending from the second base portion, the fourth post being coupled with a gate signal pin of a leadframe of the semiconductor device module.

14. The semiconductor device module of claim 10, wherein:
the signal distribution assembly is pre-molded and includes a molding compound disposed on the second side of the second metal layer;
a surface of the first post that is coupled with the first semiconductor die is exposed through the molding compound;
a surface of the second post that is coupled with the second semiconductor die is exposed through the molding compound; and
a surface of the third post that is coupled with the gate terminal of the IGBT, or with the gate terminal of the MOSFET is exposed through the molding compound.

15. The semiconductor device module of claim 10, wherein:
the first base portion of the second metal layer is coupled with a signal terminal of a leadframe of the semiconductor device module, the signal terminal being an emitter signal terminal, or a source signal terminal;
the first base portion of the second metal layer is further coupled with a thermal sense signal pin of the leadframe; and
the second base portion of the second metal layer is coupled with a gate signal pin of the leadframe.

16. A signal distribution assembly configured to conduct signals in a semiconductor device module, the signal distribution assembly comprising:
a metal layer, the metal layer having:
a first side, the first side being planar; and
a second side opposite the first side, the second side being non-planar and including:
a base portion;
a first post extending from the base portion; and
a second post extending from the base portion; and
a molding compound disposed on the second side of the metal layer, an upper surface of the first post and an upper surface of the second post being exposed through the molding compound; and
a thermally conductive ceramic layer coupled with the first side of the metal layer, the thermally conductive ceramic layer being coupled with the first side of the metal layer via a thermally conductive epoxy adhesive.

17. The signal distribution assembly of claim 16, wherein:
the base portion is a first base portion;
the first base portion, the first post and the second post are included in a first portion of the metal layer; and
the metal layer further includes a second portion having:
a second base portion; and
a third post extending from the second base portion, an upper surface of the third post being coupled being exposed through the molding compound.

18. The signal distribution assembly of claim 17, wherein:
the first portion of the metal layer further includes:
a fourth post extending from the first base portion, an upper surface of the fourth post being exposed through the molding compound; and
a fifth post extending from the first base portion, an upper surface of the fourth post being exposed through the molding compound; and
the second portion of the metal layer further includes a sixth post extending from the second base portion, an upper surface of the sixth post being exposed through the molding compound.

19. A signal distribution assembly configured to conduct signals in a semiconductor device module, the signal distribution assembly comprising:
a first metal layer, the first metal layer having:
a first side, the first side being planar; and
a second side opposite the first side, the second side being non-planar and including:
a base portion;
a first post extending from the base portion; and
a second post extending from the base portion; and
a thermally conductive insulator layer, a first surface of the thermally conductive insulator layer being coupled with the first side of the first metal layer; and
a second metal layer coupled with a second surface of the thermally conductive insulator layer opposite the first surface of the thermally conductive insulator layer.

20. The signal distribution assembly of claim 19, wherein:
the base portion is a first base portion;
the first base portion, the first post and the second post are included in a first portion of the first metal layer; and
the first metal layer further includes a second portion having:
a second base portion; and
a third post extending from the second base portion.

* * * * *